United States Patent [19]

Nakanishi et al.

[11] Patent Number: 4,837,791
[45] Date of Patent: Jun. 6, 1989

[54] COUNTER

[75] Inventors: Tadashi Nakanishi, Zama; Hironori Yamauchi, Machida, both of Japan

[73] Assignee: Nippon Telegraph and Telephone Corporation, Tokyo, Japan

[21] Appl. No.: 162,096

[22] Filed: Feb. 29, 1988

[30] Foreign Application Priority Data

Mar. 4, 1987 [JP] Japan .................................. 62-49616

[51] Int. Cl.⁴ ............................................. G06F 7/50
[52] U.S. Cl. ....................................... 377/49; 377/51;
364/746.2; 364/770
[58] Field of Search ................. 377/49, 51; 364/746.2,
364/770, 768, 786

[56] References Cited

U.S. PATENT DOCUMENTS

| | | | |
|---|---|---|---|
| 3,375,358 | 3/1968 | Franck | 364/770 |
| 3,462,589 | 8/1969 | Robertson | 364/786 |
| 3,946,219 | 3/1976 | Lucas | 364/770 |
| 4,400,615 | 8/1983 | Asami et al. | 377/51 |
| 4,623,982 | 11/1986 | Ware | 364/770 |
| 4,700,325 | 10/1987 | Ware | 364/770 |
| 4,751,631 | 6/1988 | Fisher | 377/49 |

OTHER PUBLICATIONS

The Transactions of the IECE of Japan, vol. E 69, No. 4, Apr. 1986, pp. 261/263, T. Nakanishi et al. "CMOS Radix-2 Signed-Digit Adder by Binary Code Representation".

"Binary-Compatible Signed-Digit Arithmetic" by Aulzienis, Proceedings-Fall Joint Computer Conf. 1964, pp. 663-672.

Primary Examiner—John S. Heyman
Attorney, Agent, or Firm—Staas & Halsey

[57] ABSTRACT

A high-speed counter using radix-N Signed-Digit redundancy adders, an initial value generator and an interim value generator for each digit. The initial value is selected based upon a desired count. The transfer digit and interim value for each digit are generated to eliminate a carry propagation from a lower digit position. The high-speed counter reaches a desired count with a certain delay time regardless of the starting count value.

5 Claims, 5 Drawing Sheets

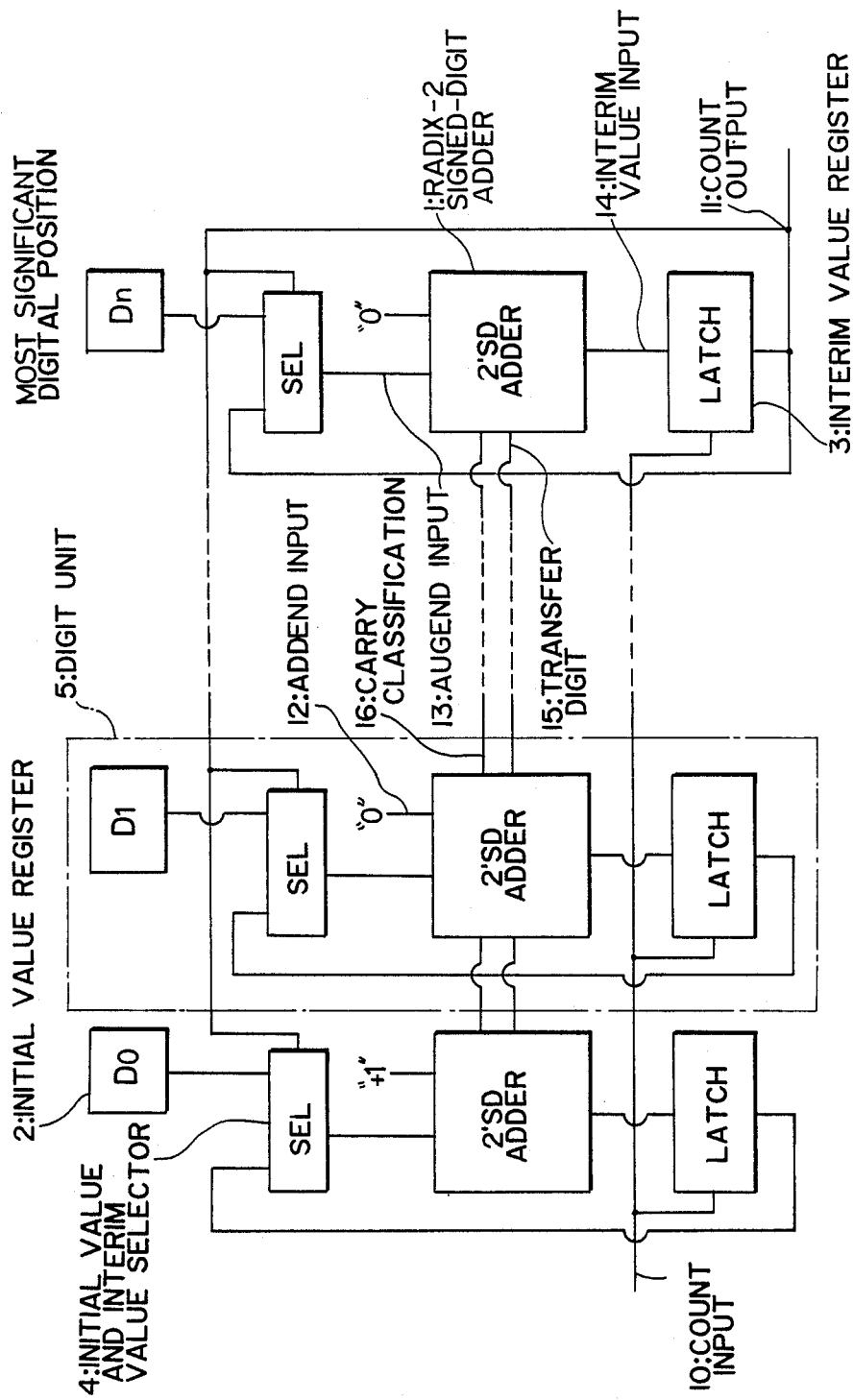

COUNTER

BACKGROUND OF THE INVENTION

1. Field of the Invention

The present invention relates to a high-speed counter.

2. Description of the Prior Art

To facilitate a better understanding of the present invention, a description will be given of a binary counter which is most commonly and widely used in the implementation of a logic circuit or similar one in an electronic computer or the like.

A conventional high-speed binary counter includes a synchronous counter formed by D flip-flops, as shown in FIG. 4. The counting operation of this counter starts with presetting therein an initial value according to a count number, followed by count-up operation counter until it detects an overflow. Reference numeral 41 indicates binary counters and 42 initial value registers.

Where a desired count value is between 0 and $2^{n+1}-1$, (n+1) flip-flops are connected and, in order to cause a digit i-th from the least significant one to perform a synchronous operation, it is necessary to detect the state in which digits less significant than the i-th digit are all 1s. Accordingly, the counting operation of the conventional system needs the AND of n+1 control signals for count-up control of the most significant digit.

A CMOS (complementary MOS) circuit is usually employed for forming a large scale integrated circuit of small power dissipation, but the maximum fan-in limit of the CMOS circuit is as small as 5 or so. The prior art system includes a circuit of a large fan-in, and hence inevitably adopts a multi-stage configuration therefore, leading to the defect that the operating speed of the conventional high-speed counter decreases with an increase in the count value.

SUMMARY OF THE INVENTION

It is therefore an object of the present invention to provide a counter which permits a high-speed operation for a certain period of time, without dependence on the count value, through utilization of a radix-2 Signed-Digit redundancy representation (which represents each digit of a binary number by one of three values −1, 0 and +1).

The counter of the present invention includes a plurality of digit units of radix-2 Signed-Digit adders, each digit comprising an adder, a transfer digit generator and an interim value generator, and an initial value generator which is supplied with a desired count value to generate an initial value, prior to the counting operation. Each digit further includes an initial value register, an initial value and iterim value selector, and an interim value register. The initial value from the initial value generator is applied to the initial value register. A carry at a specified digit, which occurs after counting-up to a desired value, is detected, thereby the counter generates a count end signal.

The primary feature of the present invention is to form each digit of the counter by a radix-2 Signed-Digit adder so as to implement a high-speed counting operation within a certain period of time, regardless of the count value.

Since binary logic is usually employed in the actual formation of a digital circuit, binary counters are most commonly and widely used in electronic computers and the like. Therefore, the high-speed counter of the present invention will hereinafter be described in connection with the case of employing the radix-2 Signed-Digit adder for each digit of the counter, but the present invention can be implemented even by use of a radix-N Signed-Digit adder.

The radix-2 Signed-Digit adder is capable of performing parallel addition without carry-propagation, permitting an addition in a certain period of time, regardless of an addend and an augend.

That is, the radix-2 Signed-Digit adder performs an addition without carry-propagation, by the following two steps of operation.

(1) In the first step, a transfer digit and an interim sum digit, which are interim values, are generated so that a carry propagation from lower digital position may be eliminated at an i-th digital position. These interim values are set in accordance with a carry classification of the (i−1)th digital position.

(2) In the second step, the transfer digit from the (i−1)th digital position and the interim digit at the i-th digital position are added together, obtaining a final sum. Since no carry-propagation occurs at this time, a high-speed addition can be achieved regardless of the digit length.

The two steps of operation mentioned above can be performed in parallel for each digit, as shown in FIG. 2. The generation of the interim sum digit and the transfer digit requires carry classification (=c) from the lower adjacent digital position, that is, from the (i−1)th digital position (see T. Nakanishi, H. Yamauchi and H. Yoshimura, "CMOS Radix-2 Signed-Digit Adder by Binary Code Representation", The Transactions of the IECE of Japan, Vol. E 69, No. 4, April 1986, pp. 261–263). Based on the value in the lower adjacent digital position, the carry classification c detects the case +1 transfer digit never occurs (indicated by c=1) and the case −1 transfer digit never occurs (indicated by c=0). In the i-th digital position the transfer digit and the interim sum digit are generated based on the carry classification.

The carry classification c is generated following the logic shown below in Table 1. The table shows that where at least either one of an addend and an augend is −1, c=1 because the +1 transfer never occurs owing to the addition of the addend and the augend in the i-th digital position and that, for other combinations of the addend and the augend, c=0 because the −1 transfer never occurs. The carry classification thus obtained is provided to higher adjacent digital position, i.e. the (i+1)th digital position.

TABLE 1

Rule (a) of addition using radix-2
Signed-Digit redundancy representation
Carry classification logic

| Augend | Addend | | |
|---|---|---|---|
| | −1 | 0 | +1 |
| −1 | c | c | c |
| 0 | c | c̄ | c̄ |
| +1 | c | c̄ | c | c: +1 transfer never occurs
c̄: transfer never occurs

Next, Table 2 shows a rule of addition according to which the transfer digit and the interim sum digit are derived from the addend and the augend n the i-th digital position, based on the carry classification c from the (i−1)th digital position.

TABLE 2

Rule (b) of addition using radix-2
Signed-Digit redundancy representation
Logic of transfer digit and interim sum digit

| Addend | Augend | Carry classification from (i − 1)th digital position (Table 1) | Transfer digit | Interim sum digit |
|---|---|---|---|---|
| +1 | −1 |  $\phi$ | +1 | 0 |
| +1 | 0 | $c$ | +1 | −1 |
| 0 | +1 | $c$ | 0 | +1 |
| 0 | 0 | $\phi$ | 0 | 0 |
| −1 | +1 |  |  |  |
| +1 | −1 |  |  |  |
| 0 | −1 | $\bar{c}$ | 0 | −1 |
| −1 | 0 | $\bar{c}$ | −1 | +1 |
| −1 | −1 | $\phi$ | −1 | 0 |

$c$: +1 transfer from the (i − 1)th digital position never occurs
$\bar{c}$: −1 transfer from the (i − 1)th digital position never occurs
$\phi$: carry classification from the (i − 1)th digital position may be either $c$ or $\bar{c}$ That is, in the cases where the sum of the addend and the augend in the i-th digital position is 00 [i.e. where (addend, augend)=(−1, +1), (+1, −1) or (0, 0)] the transfer digit and the interim sum digit are both set to 0s because no carry propagation from the (i−1)th digital position occurs. In Table 2, $\phi$ indicates that the carry classification $c$ from the (i−1)th digital position may be either 1 or 0, and this means that the transfer digit and the interim sum digit do not depend on the carry classification $c$.

In the cases where the sum of the addend and the augend is −1 [i.e. where (addend, augend)=(0, −1) or (−1, 0)], the transfer digit and the interim sum digit are generated according to the carry classification c; namely, when c=0, the transfer digit is set to 0 and the interim sum digit to −1, and when c=1, the transfer digit is set to −1 and the interim sum digit to +1. In other words, when the sum of the addend and the augend is −1, one of the two kinds of generation logic by which the transfer digit and the interim sum digit are set to 0 and −1 or −1 and +1, respectively, is chosen according to the carry classification c, thereby preventing the occurrence of the −1 carry propagation from the i-th digital position when the transfer digit from the (i=1)th digital position and the interim sum digit in the i-th digital position are added together.

In the cases where the sum of the addend and the augend is +1 [i.e. where (addend, augend)=(0, +1) or (+1, 0)] the transfer digit and the interim sum digit are generated according to the carry classification c from the (i−1)th digital position; namely, when c=1, the transfer digit is set to 0 and the interium sum digit to +1, and when c=0, the transfer digit is set to +1 and the interim sum digit to −1. In other words, when the sum of the addend and the augend is +1, one of the two kinds of generation logic by which the transfer digit and the interim sum digit are set to 0 and +1 or +1 and −1 is chosen according to the carry classification c from the (i−1)th digital position, thereby preventing the occurrence of the +1 carry propagation from the i-th digital position when the transfer digit from the (i−1)th digital position and the interim sum digit in the i-th digital position are added together.

As for the addition in the least significant digital position, there are no addend and augend in the lower adjacent digital position. In this case, c=0 is generated as the carry classification to the higher adjacent digital position, through utilization of the classification logic in which the addend and the augend are both 0s, shown in Table 1. Further, the transfer digit to the least significant digital position from the lower adjacent digital position is set to 0 by the application of the logic of transfer digit and interim sum digit in which the addend and the augend are both 0s, as shown in Table 2.

The logic of carry classification and the logic of transfer digit and interim sum digit based on the carry classification are such as shown in Tables 1 and 2, respectively. In the rows divided into two in Table 2, the upper rows show the case where the −1 transfer never occurs from the lower adjacent digital position and the lower columns show the case where the +1 transfer never occurs from the lower adjacent digital position.

FIG. 3 illustrates a specific operative example of the circuit arrangement of an adder of one digit of a radix-2 Signed-Digit adder, shown in FIG. 2, which performs an addition in accordance with the above-described rules of addition. More specifically, FIG. 3 shows an example of the adder in which each digit formed by any one of three values −1, 0 and +1 of the radix-2 Signed-Digit redundancy representation of represented by a binary code, as depicted below in Table 3, and the rules of addition shown in Tables 1 and 2 are employed.

TABLE 3

| Radix-2 Signed-Digit redundancy representation | Binary code sign (s) | value (v) |
|---|---|---|
| 0 | $\phi$ | 1 |
| +1 | 0 | 0 |
| −1 | 1 | 0 |

$\phi$: sign may be either 0 or 1

For the radix-2 Signed-Digit redundancy representation and an additional discussion of an adder utilizing this, see the afore-mentioned literature "The Transactions of the IECE of Japan, Vol. E 69, No. 4, April 1986 and for additional description of a Signed-Digit adder, also see U.S. Pat. No. 3,462,589.

BRIEF DESCRIPTION OF THE DRAWINGS

FIG. 1A is a block diagram illustrating the basic arrangement of the counter of the present invention, which comprises a radix-2 Signed-Digit adder, an initial value register, an interim value register, and an initial value and interim value selector;

DESCRIPTION OF THE PREFERRED EMBODIMENTS

Figure 1B:
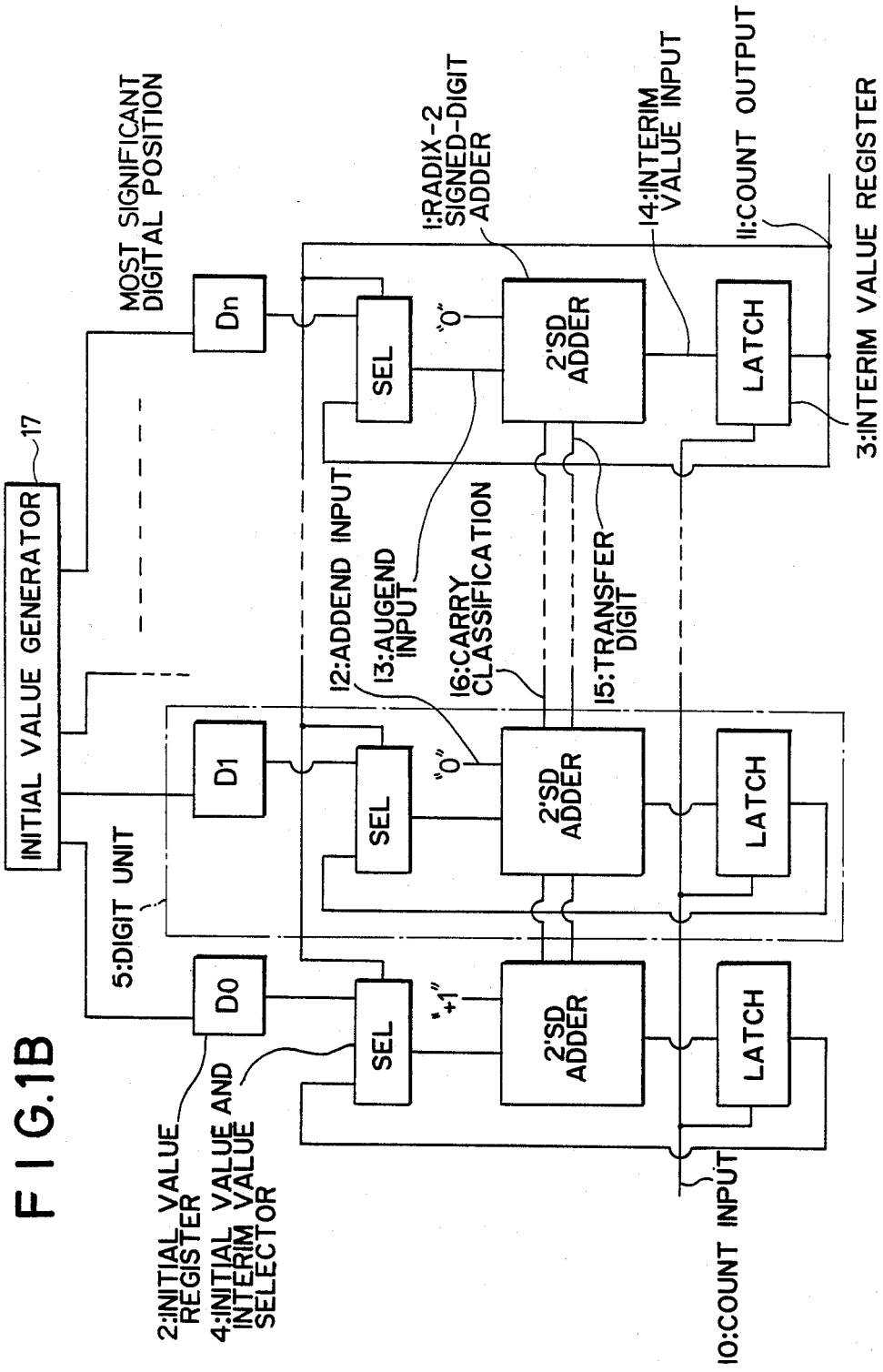
FIG. 1B is a block diagram illustrating an embodiment of the present invention which includes an initial value generator in the basic arrangement shown in FIG. 1A.
Figure 2:
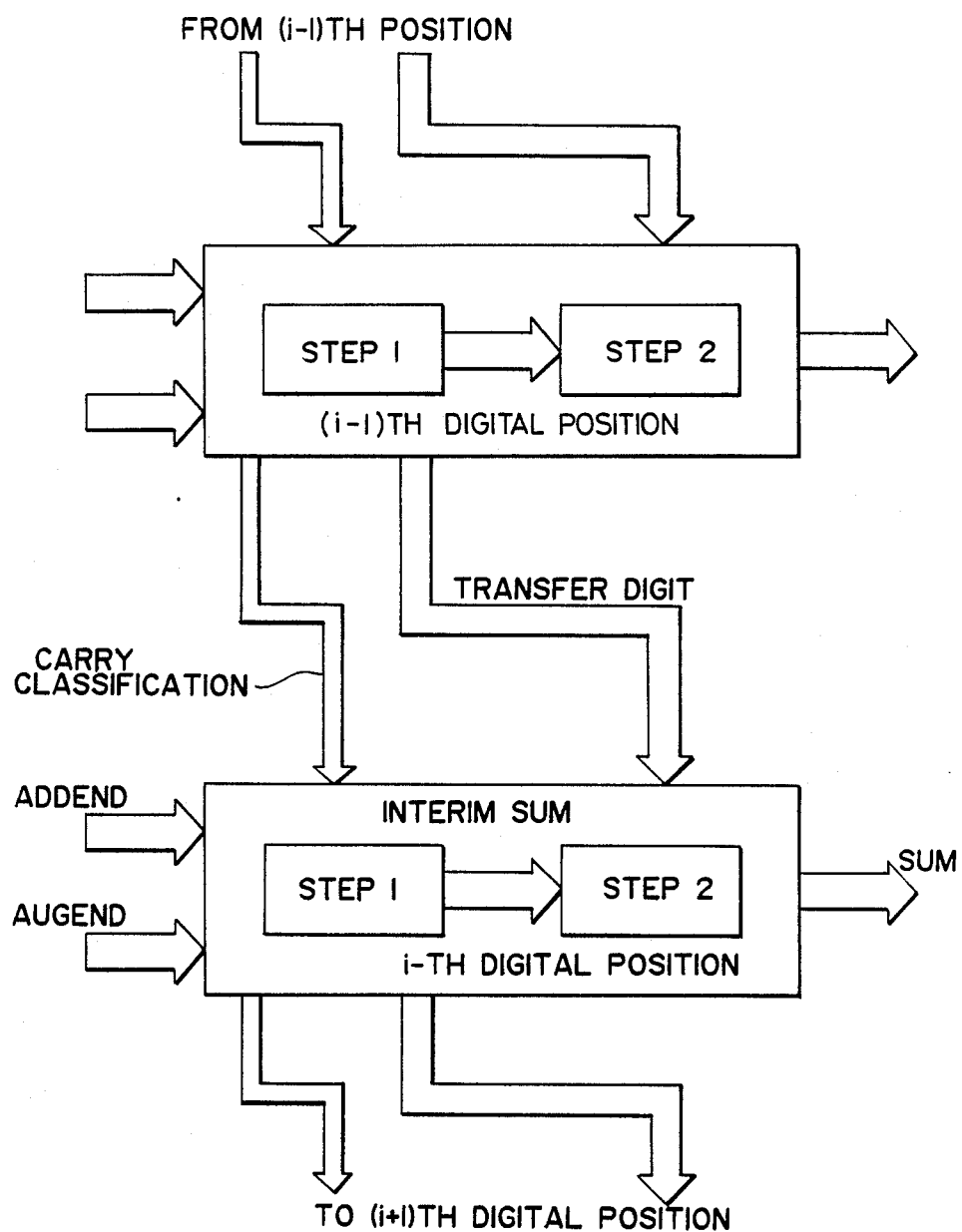
FIG. 2 is a block diagram of a radix-2 Signed-Digit adder for the i-th digital position and the (i−1)th digital position and their connection.

FIG. 1A is a block diagram of the basic arrangement of the counter of the present invention, and FIG. 1B is a block diagram of an embodiment of the present invention including an initial value generator. In FIG. 1A each digit unit 5 of the counter comprises a radix-2 Signed-Digit adder 1, an initial value register 2 for presetting an initial value, an interim value register 3 for holding an interim value during the counting operation and an initial value and interim value selector 5 for switching between the initial value and the interim value. Reference numeral 10 indicates a count input, 11 a count output, 12 an addend input, 14 an interim value input, 15 a transfer digit, and 16 a carry classification.

Figure 3:
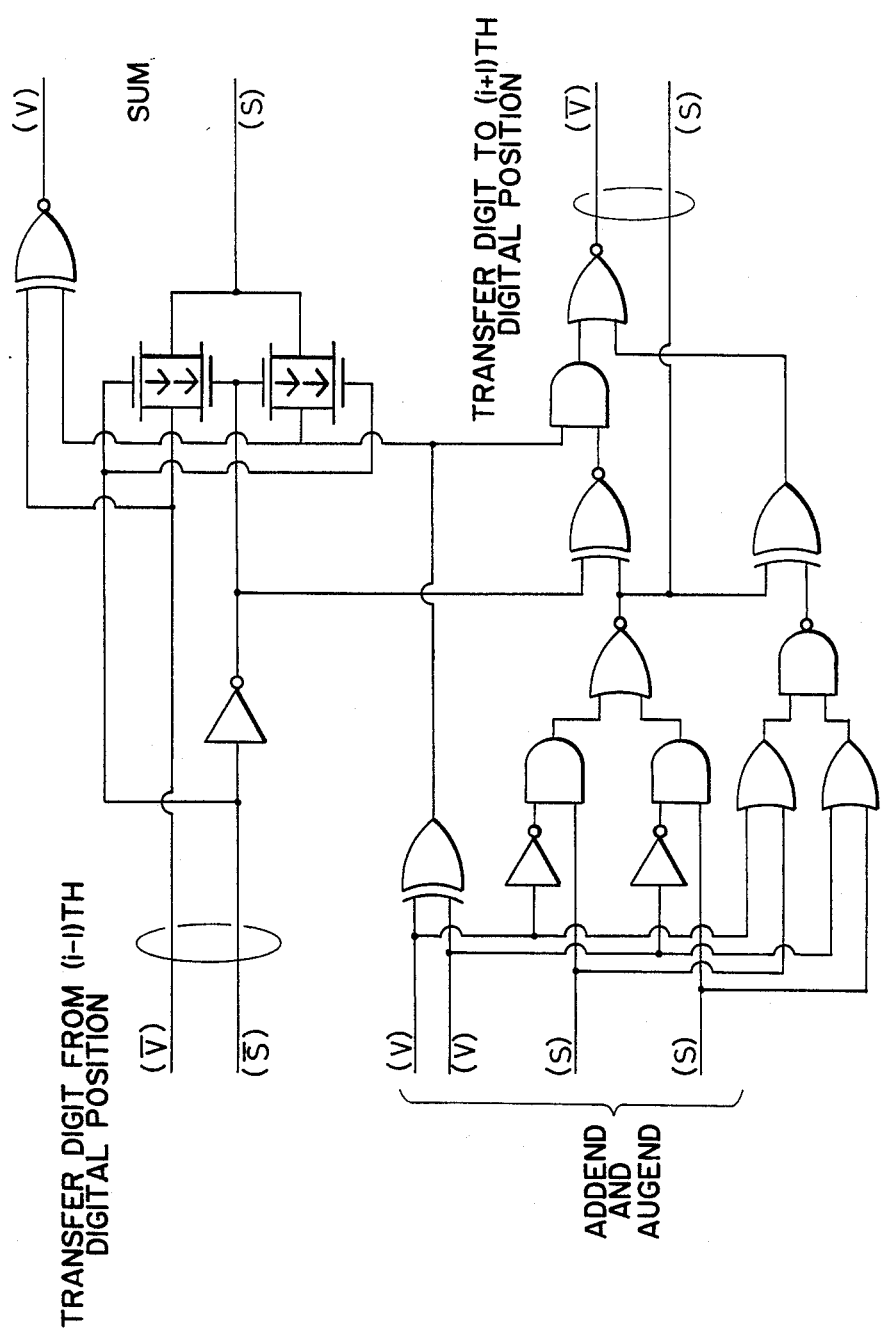
FIG. 3 is a schematic diagram illustrating an example of the circuit arrangement of the radix-2 Signed-Digit adder formed in accordance with the rules of addition shown in Tables 1 and 2.
Figure 4:
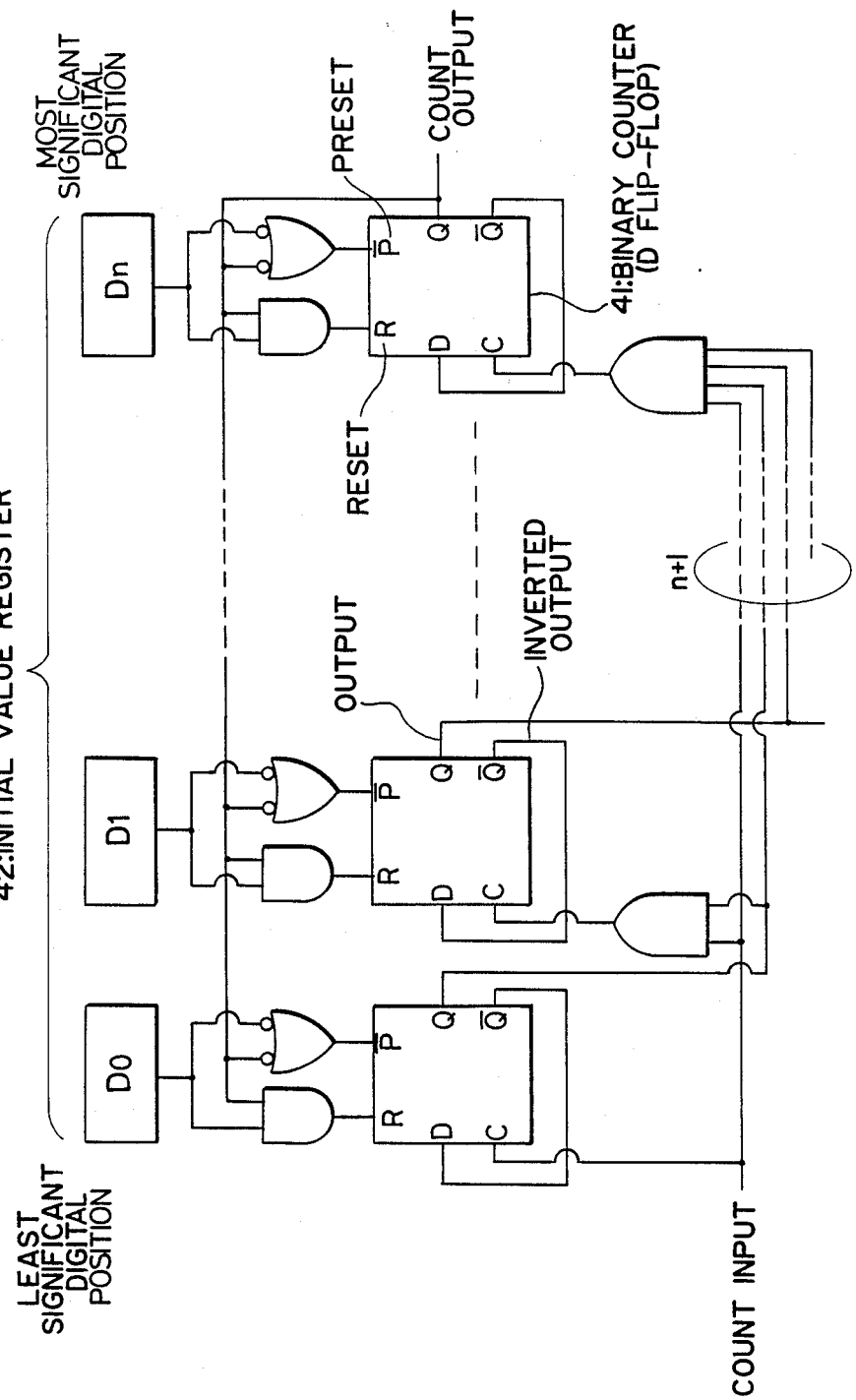
FIG. 4 is a schematic diagram showing a conventional binary counter formed by a synchronous counter using flip-flops.

Prior to the counting operation an initial value is preset in register 2. The initial value is precalculated from a count value so that an overflow can be detected at a specified digital position when the count has advanced by a desired value. After this initialization the count is started to accumulate a constant ($=+1$) for each count, and is completed upon detection of an overflow of the sum V (value) bit in the specified digital position such as shown in FIG. 3.

Now, let it be assumed that the initial value is a 0 and an operation of adding thereto a $+1$ is repeated.

When an numerical value is represented by an ordinary 2's complement, the accumulated value varies as shown in Table 4, and an overflow to the higher adjacent digital position, which results from the addition of $+1$ will occur at the point when the accumulated value has reached to a power of 2 ($2^k = 1, 2, 4, \ldots$).

TABLE 4

Example in which an overflow occurs at the point when the accumulate value reached to a power of 2 in the case of repeating the operation of accumulating $+1$ from initial value 0

| Decimal value | Complement of binary number |
|---|---|
| 0 | 0000000000000 |
| 1 ($2^0$) | 0000000000001 |
| 2 ($2^1$) | 0000000000010 |
| 3 | 0000000000011 |
| 4 ($2^2$) | 0000000000100 |
| 5 | 0000000000101 |
| 6 | 0000000000110 |
| 7 | 0000000000111 |
| 8 ($2^3$) | 0000000001000 |
| . | . |
| . | . |
| 15 | 0000000001111 |
| 16 ($2^4$) | 0000000010000 |
| . | . |
| . | . |
| 31 | 0000000011111 |
| 32 ($2^5$) | 0000000100000 |
| . | . |
| . | . |

TABLE 4-continued

Example in which an overflow occurs at the point when the accumulate value reached to a power of 2 in the case of repeating the operation of accumulating $+1$ from initial value 0

| Decimal value | Complement of binary number |
|---|---|
| 63 | 0000000111111 |
| 64 ($2^6$) | 0000001000000 |
| . | . |
| . | . |
| 127 | 0000001111111 |
| 128 ($2^7$) | 0000010000000 |
| . | . |
| . | . |

In the radix-2 Signed-Digit redundancy representation an overflow occurs in each digital position in response to a specific value, not the power of 2 as in the case of the ordinary 2's complement. The value that results in an overflow can be precalculated by via an iteration equation based on the rule of addition using the radix-2 Signed-Digit redundancy representation. That is, in the case where a circuit based on the rules of addition shown in Tables 1 and 2 is formed on the assumption of repeating an operation of adding an initial value 0 (0s at all of n digital positions in the radix-2 Signed-Digit redundancy representation of n-digit length) with 1 ($+1$ at the least significant digital position alone and 0s at all the other ($n-1$) digital positions in the radix-2 Signed-Digit redundancy representation of n-digit length), the accumulated value will undergo such changes as shown in Table 5.

In Table 5, noting the value ($=\theta_k$) at which an overflow occurs in a k-th digital position (the value at the digital position k-th from the least significant digital position changes from 0 to $+1$), the iteration equation is as follows:

$$\Theta_k = 2^{k-2} + \Theta_{k-2} + 1$$

where $k \geq 3$. Table 5 shows, by way of example, the case where k is 7. Solving this iteration equation, $$\Theta_{2j+1} = (2^{2j+1} + 3j + 1)/3 \quad (k = 2j+1)$$

$$\Theta_{2j+2} = (2^{2j+2} + 3j + 5)/3 \quad (k = 2j+2)$$

where j is a 0 or positive integer.

TABLE 5

Example of change of radix-2 Signed-Digit value in the case of accumulating $+1$ from initial value 0

Value of each digit in radix-2 Signed-Digit redundancy representation

| Decimal number | 7 | 6 | 5 | 4 | 3 | 2 | 1 | 0 | |
|---|---|---|---|---|---|---|---|---|---|
| 0 | 0 | 0 | 0 | 0 | 0 | 0 | 0 | 0 | |
| 1 | 0 | 0 | 0 | 0 | 0 | 0 | +1 | −1 | $\theta_1$ |
| 2 | 0 | 0 | 0 | 0 | 0 | 0 | +1 | 0 | |
| 3 | 0 | 0 | 0 | 0 | 0 | +1 | 0 | −1 | $\theta_2$ |
| 4 | 0 | 0 | 0 | 0 | +1 | −1 | 0 | 0 | $\theta_3$ |
| 5 | 0 | 0 | 0 | 0 | +1 | −1 | +1 | −1 | |
| 6 | 0 | 0 | 0 | 0 | +1 | −1 | +1 | 0 | |
| 7 | 0 | 0 | 0 | 0 | +1 | 0 | 0 | −1 | |
| 8 | 0 | 0 | 0 | +1 | −1 | 0 | 0 | 0 | $\theta_4$ |
| 9 | 0 | 0 | 0 | +1 | −1 | 0 | +1 | −1 | |
| 10 | 0 | 0 | 0 | +1 | −1 | 0 | +1 | 0 | |
| 11 | 0 | 0 | 0 | +1 | −1 | +1 | 0 | −1 | |
| 12 | 0 | 0 | 0 | +1 | 0 | −1 | 0 | 0 | |
| 13 | 0 | 0 | +1 | −1 | 0 | −1 | +1 | −1 | $\theta_5$ |
| 14 | 0 | 0 | +1 | −1 | 0 | −1 | +1 | 0 | |

TABLE 5-continued

Example of change of radix-2 Signed-Digit value in the case of accumulating +1 from initial value 0

| Decimal number | Value of each digit in radix-2 Signed-Digit redundancy representation | | | | | | | | |
|---|---|---|---|---|---|---|---|---|---|
| | 7 | 6 | 5 | 4 | 3 | 2 | 1 | 0 | |
| 15 | 0 | 0 | +1 | −1 | 0 | 0 | 0 | −1 | |
| 16 | 0 | 0 | +1 | −1 | 0 | 0 | 0 | 0 | |
| 17 | 0 | 0 | +1 | −1 | 0 | 0 | +1 | −1 | |
| 18 | 0 | 0 | +1 | −1 | 0 | 0 | +1 | 0 | |
| 19 | 0 | 0 | +1 | −1 | 0 | +1 | 0 | −1 | |
| 20 | 0 | 0 | +1 | −1 | +1 | −1 | 0 | 0 | |
| 21 | 0 | 0 | +1 | −1 | +1 | −1 | +1 | −1 | |
| 22 | 0 | 0 | +1 | −1 | +1 | −1 | +1 | 0 | |
| 23 | 0 | 0 | +1 | −1 | +1 | 0 | 0 | −1 | |
| 24 | 0 | 0 | +1 | 0 | +1 | 0 | 0 | 0 | |
| 25 | 0 | +1 | −1 | 0 | −1 | 0 | +1 | −1 | $\theta_6$ |
| 26 | 0 | +1 | −1 | 0 | −1 | 0 | +1 | 0 | |
| 27 | 0 | +1 | −1 | 0 | −1 | +1 | 0 | −1 | |
| 28 | 0 | +1 | −1 | 0 | 0 | −1 | 0 | 0 | |
| 29 | 0 | +1 | −1 | 0 | 0 | −1 | +1 | −1 | |
| 30 | 0 | +1 | −1 | 0 | 0 | −1 | +1 | 0 | |
| 31 | 0 | +1 | −1 | 0 | 0 | 0 | 0 | −1 | |
| 32 | 0 | +1 | −1 | 0 | 0 | 0 | 0 | 0 | $2^5$ |
| 33 | 0 | +1 | −1 | 0 | 0 | 0 | +1 | −1 | |
| 34 | 0 | +1 | −1 | 0 | 0 | 0 | +1 | 0 | |
| 35 | 0 | +1 | −1 | 0 | 0 | +1 | 0 | −1 | |
| 36 | 0 | +1 | −1 | 0 | +1 | −1 | 0 | 0 | |
| 37 | 0 | +1 | −1 | 0 | +1 | −1 | +1 | −1 | |
| 38 | 0 | +1 | −1 | 0 | +1 | −1 | +1 | 0 | |
| 39 | 0 | +1 | −1 | 0 | +1 | 0 | 0 | −1 | |
| 40 | 0 | +1 | −1 | +1 | −1 | 0 | 0 | 0 | $\theta_5+1$ |
| 41 | 0 | +1 | −1 | +1 | −1 | 0 | +1 | −1 | |
| 42 | 0 | +1 | −1 | +1 | −1 | 0 | +1 | 0 | |
| 43 | 0 | +1 | −1 | +1 | −1 | +1 | 0 | −1 | $\theta_k = 2^{k-2}$ |
| 44 | 0 | +1 | −1 | +1 | 0 | −1 | 0 | 0 | $+\theta_{k-2}+1$ |
| 45 | 0 | +1 | 0 | −1 | 0 | −1 | +1 | −1 | |
| 46 | +1 | −1 | 0 | −1 | 0 | −1 | +1 | 0 | $\theta_7$ |

There exists more than one representation for numerical values, except 0, with the radix-2 Signed-Digit redundancy representation of n-digit length. For powers of 2 larger than $4(2^k=4, 8, 16, \ldots)$, many representation ae possible as shown later in Table 6. It will be appreciated that the results (i.e. $2^k+1=5, 9, 17, \ldots$) of addition with +1 (+1 at the least significant digital position alone and 0s at all the other (n−1) digital positions in the radix-2 Signed-Digit redundancy representation of n-digit length), through application of the rules of addition shown in Tables 1 and 2, assume the same radix-2 Signed-Digit redundancy representation when any of these representated values is used as the augend, as shown later in Table 7. That is, no matter what radix-2 Signed-Digit redundancy representation may be used for a value p $(2^{q-1} \leq p \leq 2^q-1)$ which is preset as the initial value for the counter, the accumulated value obtained by repeatedly adding +1 (+1 only at the least significant digital position and 0's at all the other (n−1) digital positions in the radix-2 Signed-Digit redundancy representation of n-digit length) through application of the rules of addition shown in Tables 1 and 2 should be represented in the same form as the accumulated value obtained at a point $2^q+1$ in Table 5; that is, the accumulated value obtained by repeatedly adding +1 (+1 only at the least significant digital position and 0s at all the other (n−1) digital positions in the radix-2 Signed Digit redundancy representation of n-digit length) to the initial value 0 (0s at all n-digits in the radix-2 Signed-Digit redundancy representation of n-digit length). Accordingly, it will be seen that in the case of further repeating the addition of +1, the accumulated value will undergo exactly the same changes as shown in Table 5. This indicates that the same iteration equation as mentioned previously will hold true for the value ($\Theta_k$) at which an overflow occurs at the k-th digital position (that is, the value at the digital position k-th from the least significant digital position changes from 0 to +1) after the accumulated value has become greater than $2^q+1$.

For the reasons mentioned above, in order to implement a count value A ($\Theta_{k-1} \leq A \leq \Theta_k$), a value obtained by subtracting the count value from the value ($=\Theta_k$) at which an overflow occurs at the k-th digital position is preset as the initial value. In this instance, each digit of the preset value represented by an ordinary 2's complement is replaced with a digit represented by the radix-2 Signed-Digit redundancy code (namely, the value 0 or 1 of each digit represented by the 2's complement is replaced with 0 or +1, respectively, in the radix-2 Signed redundancy representation).

In the above, dots indicate that the value of the digit is equal to those of the higher adjacent and lower adjacent digits.

TABLE 7

Example of addition of +1 to power of 2 according to rules of addition shown in Tables 1 and 2

| | Value of each digit by n-digit radix-2 Signed-Digit redundancy representation |
|---|---|
| Augend (accumulated value = $2^k$) | 0 ... 0   +1   −1 ........ −1   −1   0 ...... 0   0 |
| (+1) Addend | 0 ... 0    0    0 ........  0    0   0 ...... 0  +1 |
| Interim sum digit | 0 ... 0   +1   +1 ........ +1   −1   0 ...... 0  −1 |
| Transfer digit | 0 ... 0   −1   −1 ... −1    0    0   0 ... 0  +1   0 |
| Result of addition (accumulated value = $2^k+1$) | 0 ................   0   +1  −1   0 ... 0  +1  −1 |

Value of each digit of the added results represented by 2' complement representation of n-digit binary number

0 ................    0    1    0 ........ 0    1

In the above, dots indicates that the value of the digit is equal to those of the higher adjacent and lower adjacent digits.

For example, when the desired count value is 41, since $\Theta_6=25$ and $\Theta_7=46$, 5 [ordinary 7-digit 2's complement code (0000101)] is selected as the initial value. All seven bits representing the value 5 are preset in the initial value register 2 in FIG. 1, in the ascending order of +1, 0, +1, 0, 0, 0 an 0, and an overflow which occurs at the 7th digital position is detected.

Next, a description will be given of the operation of respective parts of the circuit shown in FIG. 1B.

Prior to the counting operation, the values k and $\Theta_k$ and the preset value are calculated from the desired count value A by the above-described method. Based on the values thus obtained, the counter shown in FIG. 1 is formed by digit units of (k+1) digits so that n equals k.

An interim value register 3 is synchronized with counting pulses from a count input 10 and is supplied with a new interim value which is the result of addition obtained by a radix-2 Signed-Digit adder 1, from an interim value input 14, and updates this interim value.

An addend input 12 of the radix-2 Signed-Digit adder 1 for each digit is fixedly supplied with "+1" at the least significant digital position and "0s" at the other digital positions (corresponding to a value 1 as a whole). Accordingly, by adding the value 1 in the radix-2

TABLE 6

Example of radix-2 Signed-Digit redundancy representation of powers of 2

Value of each digit by radix-2 Signed-Digit redundancy representation of n-digit length

```
0 ........................   0   +1   0 ... 0  ⎫
0 ..................... 0   +1   −1   0 ... 0  ⎪
0 ................ 0   +1   −1   −1   0 ... 0  ⎪
0 ............ 0   +1   −1 ...... −1   0 ... 0  ⎬ all the same value
0 ........ 0   +1   −1 .......... −1   0 ... 0  ⎪
                    .                           ⎪
                    .                           ⎪
0    0   +1   −1 .................. −1   −1   0 ... 0  ⎪
0   +1   −1 ....................... −1   −1   0 ... 0  ⎪
+1   −1 ............................ −1   −1   0 ... 0  ⎭
```

Value of each digit represented by 2' complement representation of n-digit binary number

0 ............................    0    1    0 ... 0

Signed-Digit redundancy representation to the value of an augend input 13, which is also the output of an initial value and interim value selector 4, what is called an increment operation is realized, thereby performing a count-up operation of the counter.

Further, the most significant digital position of an interim value register 4 is used as a count output 11 and a control signal for the initial value and interim value selector 4. When the most significant digital position is "+1", the initial value and iterim value selector 4 selects the output value of the initial value register 2, and, at the same time, generates a count end pulse to the count output 11. When the most significant digital position is "0", the initial value and interim value selector 4 selects the output value of the interim value register 3 and sends it to the addend input 12 of the radix-2 Signed-Digit adder 1 without generating count end pulse to the count output 11.

Prior to the counting operation (time $t \leq 0$) the preset value $(\Theta_k - A)$ calculated from the desired count value A by the afore-said method is generated by an initial value generator 17 and the stored into the initial value register 2. Moreover, "+1" in the radix-2 Signed-Digit redundancy representation is stored into the interim value register 2, for each digit, prior to the counting operation.

Upon application of the count pulse at the count input, the counter starts counting (time $t \geq 0$). At the start of the counting operation ($t = 0$), the initial value and interim value selector 4 selects the output value of the initial value register 2, which is sent to the augend input 13 of the radix-2 Signed-Digit adder 1. To the addend input 12 are sent "+1" at the least significant digital position and "0s" at the other digital positions, and the result of addition is provided to an interim value input 14 of the interim value register 3. After arrival of one pulse ($t = 1$) the interim value register 3 updates its value to a new interim value (i.e. the preset initial value plus one). At this time, since a "0" is stored into the most significant digital position, the initial value and interim value selector 4 selects the output value of the interim value register 3 and provides it to the augend input 13 of the radix-2 Signed-Digit adder 1.

Thereafter ($2 \leq t \leq A$), the interim value register 3 will update its contents from a value provided at the time of the arrival of the immediately preceding pulse (i.e. a value provided at the time $t = j - 1$) to a new interim value which is the result of addition obtained by the radix-2 Signed-Digit adder 1. Upon each updating a "0" is stored into the most significant digital position.

At the time of the A-th count input pulse (i.e. at the time $t = A$), since $\Theta_k$ has been stored in the interim value register 3, "+1" is held at the most significant digital position in place of "0". Consequently, the count end pulse is sent to the count output 11 for the first time after starting the counting operation.

As described above, the initial value to be preset can easily be precalculated by subtracting the count value from the value at which an overflow occurs.

In the case of employing the counter of the present invention, it is necessary only to provide counters of a required number of digits in accordance with the count value, preset the initial value which is determined by the count value, and detect an overflow at a specified digital position.

Unlike conventional counters, the counter of the present invention does not include a circuit of a large fan-in even if the count value is large. Also in the case where the counter is formed by a CMOS, which has generally a small fan-in limit but is widely used in a large scale integrated circuit because of its small power dissipation, the counter can operate at high speed with a certain delay time of operation, regardless of an increase in the desired count value.

For a radix-N Signed-Digit adder also, it is possible to calculate a value at which an overflow occurs at each digital position and to precalculate the initial value corresponding to the count value, through use of an iteration equation based on the rules of addition by using a Signed-Digit arithmetic technique. Accordingly, a Signed-Digit counter of high-speed operation can be realized by the radix-N Signed-Digit adder, the initial value register and the interim value register and the initial value and interim value selector.

As mentioned above, since the counter of the present invention does not include a circuit of a large fan-in limit even if the desired count value increases, the counter, even if formed by the CMOS logic circuit or the like, can operate at high speed, with a certain delay time of operation, regardless of an increase in the desired count value.

As described above, according to the present invention, a counter which is capable of performing a high-speed operation with a certain delay time of operation, regardless of an increase in the count value, can be provided through utilization of the radix-2 Signed-Digit redundancy representation.

It will be apparent that many modifications and variations may be effected without departing from the scope of the novel concepts of the present invention.

What is claimed is:

1. A counter comprising:
    an initial value generator means for calculating and providing, as an output, an initial value;
    preset circuit means for presetting the initial value calculated by the initial value generator means;
    an adder circuit including
        plural digits of radix-2 Signed-Digit adders, each including an adder, transfer digit generator means for generating a transfer digit and interim sum digit generator means for generating an interim sum digit; and
    detecting circuit means for detecting an overflow at a specified one of said digits of radix-2 Signed-Digit adders.

2. The counter of claim 1, wherein the initial value generator means includes:
    means for obtaining a value $\Theta_k$ at which an overflow occurs at a k-th one of said digits of radix-2 Signed-Digit adders when the counter is counted up from 0, in accordance with the following equations:

$$\Theta_{2j+1} = (2^{2j+1} + 3j + 1)/3 \quad (k = 2j+1)$$

$$\Theta_{2j+2} = (2^{2j+2} + 3j + 5)/5 \quad (k = 2j+2)$$

(j being a 0 or positive integer);
    means for selecting the value k so that a desired count value A satisfies the condition $\Theta_{k-1} \leq A \leq \Theta_k$; and
    means for supplying, to the preset circuit, a value having subtracted A from $\Theta_k$, in the form of radix-2 Signed-Digit redundancy representation.

3. The counter of claim 1, wherein each of the radix-2 Signed-Digit adders comprises:
    carry means for generating a carry classification;

first means for generating the transfer digit and the interim sum digit on the basis of the carry classification from a lower adjacent radix-2 Signed-Digit adder; and second means for adding the transfer digit from the lower radix-2 Signed-Digit adder and the interim sum digit to generate a sum.

4. The counter of claim 3, wherein said carry means includes means for generating the carry classification based on input values of an addend and an augend to each of said radix-2 Signed-Digit adders, and the following table:

| Augend | Addend | | |
|---|---|---|---|
| | −1 | 0 | +1 |
| −1 | c | c̲ | c̲ |
| 0 | c | c̲ | c̲ |
| +1 | c | c | c | wherein
c̲: denotes a +1 transfer digit never occurs
c: denotes a −1 transfer digit never occurs 5. The counter of claim 3, wherein said first means includes means for generating the interim sum digit and the transfer digit based on input values of an addend, an augend and the carry classification from the lower adjacent radix-2 Signed-Digit adder and in accordance with the following

| Addend | Augend | Carry classification from lower adjacent digital position | Transfer digit | Interim sum digit |
|---|---|---|---|---|
| +1 | −1 | φ | +1 | 0 |
| +1 | 0 | c | +1 | −1 |
| 0 | +1 | c | 0 | +1 |
| 0 | 0 | φ | 0 | 0 |
| −1 | +1 | | | |
| +1 | −1 | | | |
| 0 | −1 | c̄ | 0 | −1 |
| −1 | 0 | c̄ | −1 | +1 |
| −1 | −1 | φ | −1 | 0 | wherein
c: denotes a condition where +1 transfer digit from the lower adjacent radix-2 Signed-Digit adder never occurs
c̄: denotes a condition where −1 transfer digit from the lower adjacent radix-2 Signed-Digit adder never occurs
φ: denotes a condition where carry classification from the lower adjacent radix-2 Signed-Digit adder may be either c or c̄

* * * * *